United States Patent
Uchino et al.

(10) Patent No.: US 6,984,972 B2
(45) Date of Patent: Jan. 10, 2006

(54) CARRIER TRANSPORTING APPARATUS, METHOD OF TRANSPORTING A CARRIER AND TRANSPORTING APPARATUS

(75) Inventors: Yoshiaki Uchino, Tokyo (JP); Osamu Arakawa, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 558 days.

(21) Appl. No.: 09/985,609

(22) Filed: Nov. 5, 2001

(65) Prior Publication Data

US 2002/0063557 A1 May 30, 2002

(30) Foreign Application Priority Data

Nov. 24, 2000 (JP) ........................................ 2000-358192

(51) Int. Cl.
*G01R 31/02* (2006.01)

(52) U.S. Cl. ...................................... 324/158.1; 324/760
(58) Field of Classification Search .............. 324/158.1, 324/760, 765
See application file for complete search history.

(56) References Cited

U.S. PATENT DOCUMENTS

| 5,247,247 | A | * | 9/1993 | Kase ........................ 324/158.1 |
| 5,345,170 | A | * | 9/1994 | Schwindt et al. ........... 324/754 |
| 6,339,321 | B1 | * | 1/2002 | Yamashita et al. ....... 324/158.1 |
| 6,762,616 | B2 | * | 7/2004 | Kawaguchi et al. ........ 324/765 |

* cited by examiner

*Primary Examiner*—Ernest Karlsen
(74) *Attorney, Agent, or Firm*—Oliff & Berridge, PLC

(57) ABSTRACT

A carrier transporting apparatus comprises a thermostat for testing devices loaded on a carrier, and the carrier is carried out from the thermostat through an opening formed in the thermostat. A shutter is provided for opening and closing the opening, and a carrier guide is integrated with the shutter. As the shutter is opened for carrying out the carrier from the test section, the carrier guide is moved to a waiting position where the carrier guide does not obstruct the carrier. As the shutter is closed after the carrier is carried out, the carrier guide is moved to a guiding position where the carrier guide guides the carrier in a direction to cross the direction in which the carrier is carried out from the thermostat. Thereafter, the carrier guide guides the carrier so that the carrier is transported in the cross direction.

7 Claims, 5 Drawing Sheets

CARRIER TRANSPORTING APPARATUS, METHOD OF TRANSPORTING A CARRIER AND TRANSPORTING APPARATUS

BACKGROUND OF THE INVENTION

1. Field of the Invention

The present invention relates to a carrier transporting apparatus and a method of transporting a carrier on which devices under test, such as integrated circuits (hereinafter, simply referred to as "ICs"), are loaded. As an example, such a carrier transporting apparatus is useful to be adapted to an automatic handler. An automatic handler loads assembled devices under test on a carrier for supplying the devices under test to a test section automatically. Thereafter, the automatic handler takes out the devices under test from the carrier, and then automatically sorts and accommodates the devices in accordance with results of the test.

2. Description of Related Art

Figure 1:
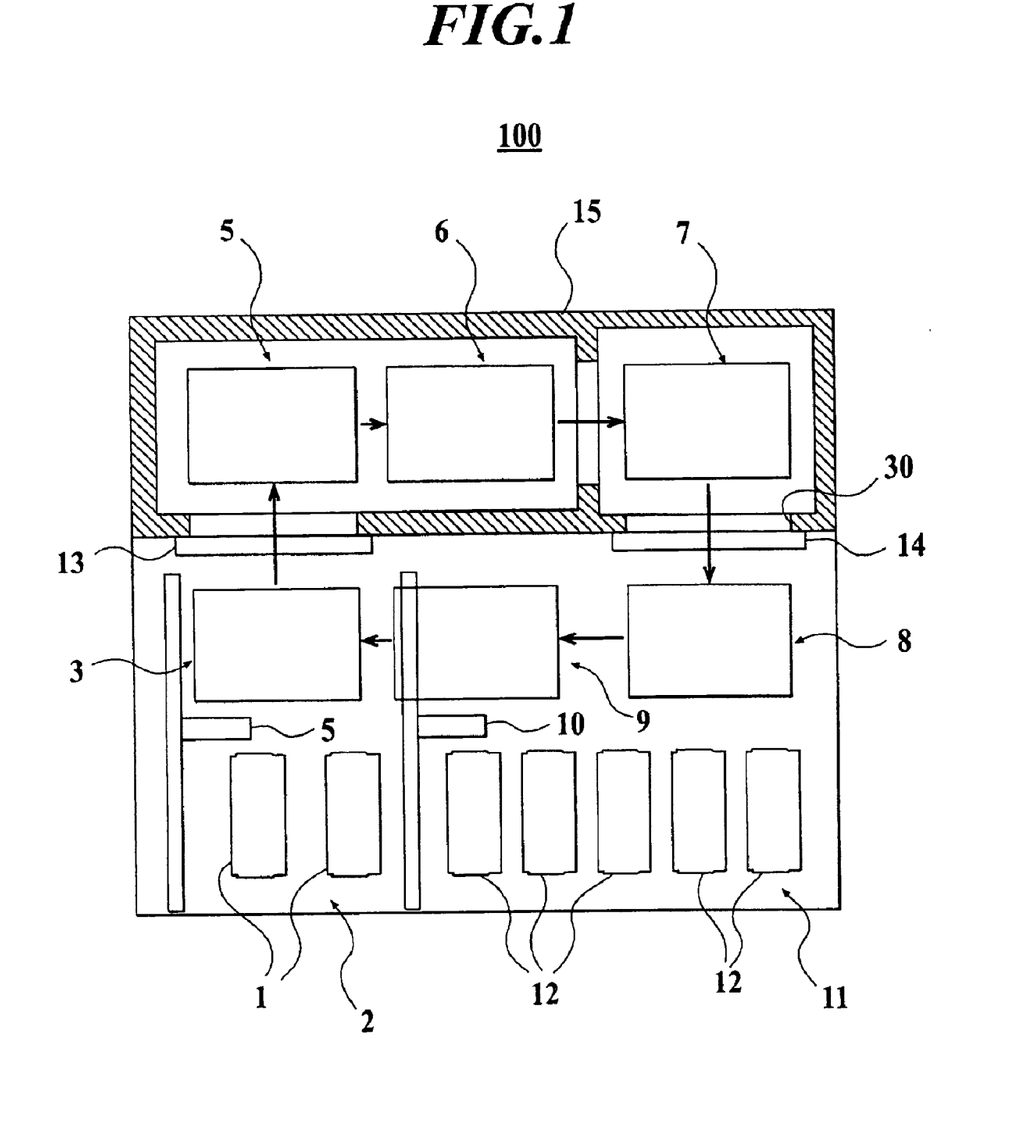
FIG. 1 is a plane view illustrating an automatic handler to which a carrier transporting apparatus is applied.
Figure 4A:
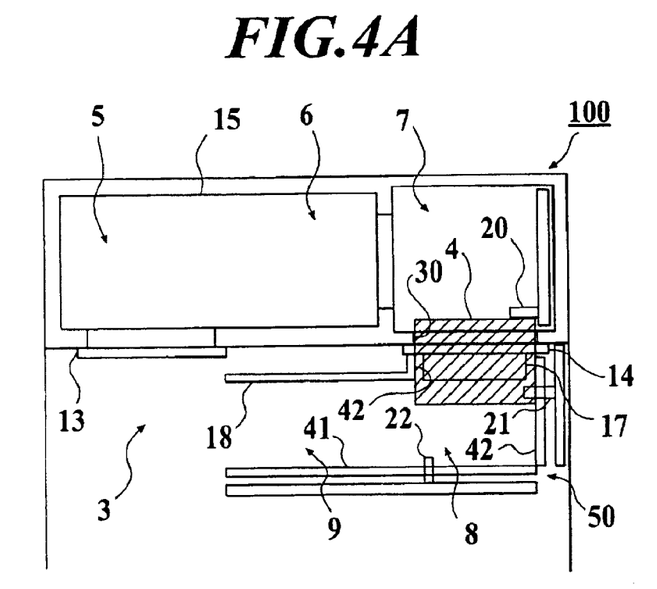
Figure 4B:
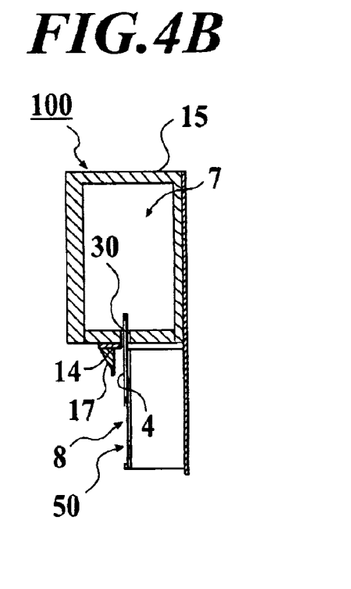

Firstly, a carrier transporting method using an automatic handler that employs an carrier transporting apparatus in the earlier technology will be schematically explained. FIG. 1 is a plane view for illustrating a carrier transporting method using an automatic handler. As shown in FIG. 1, a large number of assembled devices under test such as ICs are disposed on a supply tray 1 in a loading section 2. The devices under test are shifted from the supply tray 1 onto a carrier 4 in a supply section 3 (see FIG. 4) by suction and suction release operation of a supply hand 5. The carrier 4 has plate-like shape and has a large number of recesses to accommodate ICs. After shifting the ICs onto the carrier 4, an entrance shutter 13 of a thermostat 15 is opened, and the carrier 4 is carried in a preheat section 5 in the thermostat 15 through the opened entrance shutter 13. The entrance shutter 13 is closed after the carrying in. The ICs loaded on the carrier 4 are heated or cooled to a predetermined temperature in the preheat section 5. After the preheating, the carrier 4 is transported to a measuring section 6 inside the thermostat 15, and each of the ICs loaded on the carrier 4 is tested by an IC tester (not shown) under a condition of the predetermined temperature condition. The carrier 4 with the tested ICs is transported to a drying chamber 7 in the thermostat 15 and then heated and dried. This drying operation is performed to prevent dewing of the carrier 4 and the ICs outside the thermostat 15 when the carrier 4 is cooled.

After the drying by heating, an exit shutter 14 of the thermostat 15 is opened, and the dried carrier 4 is carried out from the thermostat 15 to a buffer section 8. The exit shutter 14 is closed after the carrying out. In the buffer section 8, a direction of transporting the carrier 4 is changed to a direction that crosses a carrying-out direction in which the carrier 4 is carried out from the thermostat 15, that is a direction towards a supply section 3, so that the carrier 4 is transported to a accommodation section 9. In the accommodation section 9, the ICs on the carrier 4 are sorted and accommodated on an accommodation tray 12 in an unloader section 11 by suction and suction release operation of an accommodation hand 10, in accordance with results of the test in the thermostat 15. The empty carrier 4 is transported to the supply section 3. By repeating the above-described steps, ICs are successively tested, sorted and accommodated in accordance with results of the test.

During the steps where the carrier 4 is carried out from the thermostat 15 and transported to the accommodation section 9 or the supply section 3, it is required that the direction of transporting the carrier 4 is changed to the direction which crosses the carrying-out direction in the buffer section 8.

Figure 7A:
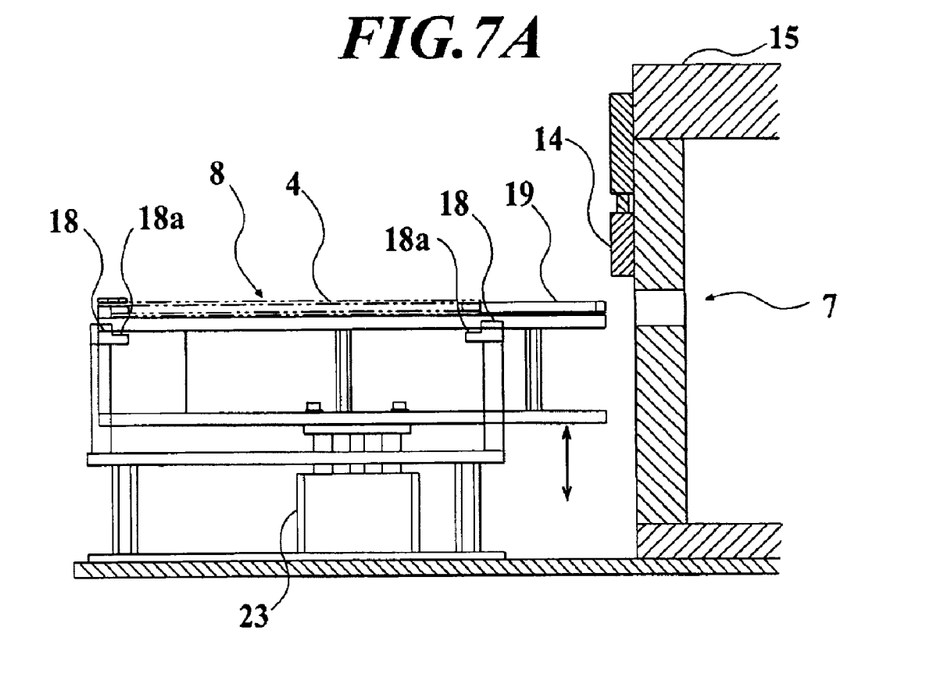
FIGS. 7A and 7B are cross-sectional views schematically showing main sections of an exit of a test section and the vicinity thereof of an earlier developed carrier transporting apparatus.
Figure 7B:
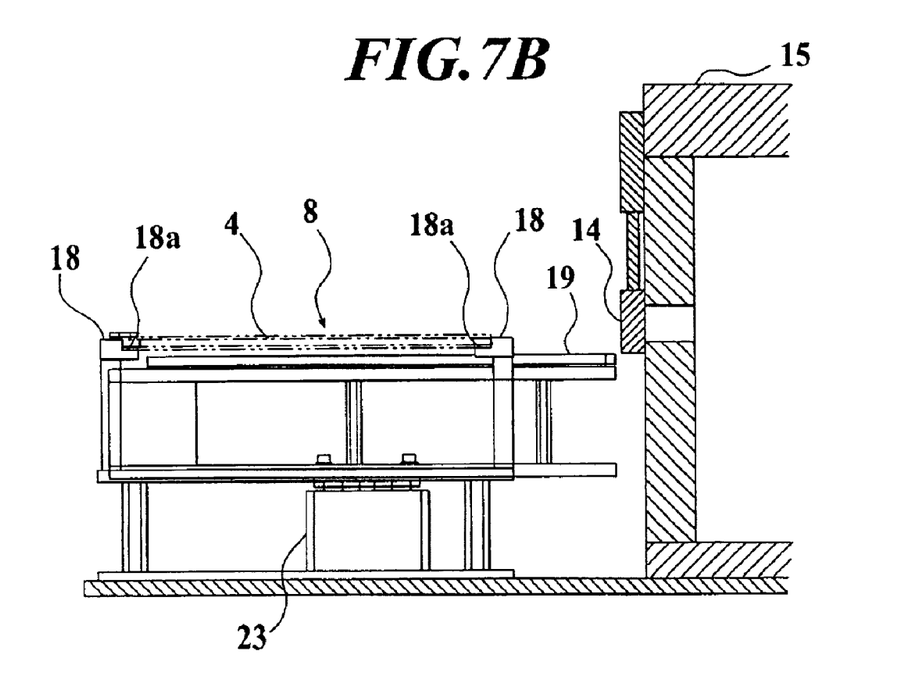

Hereinafter, the structure of principal portions of the earlier developed carrier transporting apparatus and a method of changing the transporting direction thereof will be explained with reference to FIGS. 7A and 7B. As shown in FIGS. 7A and 7B, the earlier developed carrier transporting apparatus comprises a carrying-out direction guide 19 and a cross direction guide 18. The carrying-out direction guide 19 guides a carrier 4 in a carrying-out direction when the carrier 4 is carried out from a thermostat 15. After the carrier 4 is guided by the carrying-out direction guide 19 and transported to the buffer section 8, the cross direction guide 18 guides the carrier 4 in a cross direction that is a direction to cross the carrying-out direction, when the carrier 4 is transported in the cross direction.

The carrying-out direction guide 19 and the cross direction guide 18 are configured to be separately moved upward and downward by a cylinder 23. When the carrier 4 is carried out, the cross direction guide 18 is moved downward to wait at a predetermined position so that the cross direction guide 18 will not obstruct the carrier 4. On the other hand, the carrying-out direction guide 19 is previously moved upward to wait at another predetermined place (see FIG. 7A). Therefore, the carrying-out direction guide 19 can receive the carrier 4 from the thermostat 15 while the carrier 4 is held horizontal. The carrier 4 is guided by the carrying-out direction guide 19 and carried out to the buffer section 8, while the carrier 4 is held horizontal during these operations, as shown in FIG. 7A. Thereafter, in order to transport the carrier 4 in the cross direction successively, the carrying-out direction guide 19 is moved downward to a predetermined position and the cross direction guide 18 is moved upward to another predetermined position previously.

Practically, the carrier 4 is moved downward with the carrying-out direction 19 section of the way, and received by the cross direction guide 18 before the carrying-out direction guide 19 reaches to the predetermined position. The carrying-out direction guide 19 is continuously moved downward to the predetermined position, so that the carrying-out direction guide 19 does not obstruct the carrier 4 during the cross direction transportation (see FIG. 7B). When the carrier 4 is shifted from the carrying-out direction guide 19 to the cross direction guide 18, the cross direction guide 18 holds the carrier 4 with hold guides 18a. In this way, after the carrier 4 is shifted to the cross direction guide 18, while the carrier 4 is guided by the hold guides 18a of the cross direction guide 18, the carrier 4 is transported in the cross direction.

However, the earlier developed carrier transporting apparatus as described above requires an elevator mechanism, such as the cylinder 23 or the like, for moving the guides upward and downward so that the carrier 4 is shifted from the carrying-out direction guide 19 to the cross direction guide 18, and a space for such an elevator system is also required. Moreover, the carrier 4 can not be carried out from the thermostat 15 until completion of the step of moving upward the carrying-out direction guide 19 to a position for receiving the carrier 4 and the step of moving downward the cross direction guide 18 to a position where the cross direction guide 18 does not obstruct the carrier 4. As a result, it takes considerable time to carry out the carrier 4. Furthermore, the carrier 4 can not be transported in the cross direction until completion of the step of shifting the carrier 4 by moving downward the carrying-out direction guide 19 and moving upward the cross direction guide 18 and the step of moving downward the carrying-out direction guide 19 to a position where the carrying-out direction guide 18 does not obstruct the carrier 4. As a result, it takes considerable time to carry out the carrier 4.

SUMMARY OF THE INVENTION

An object of the present invention is to provide a carrier transporting apparatus for transporting a carrier with a simple structure which does not require upward and downward movements of a carrier and carrier guides and a system for such movements. According to the carrier transporting apparatus with such a simple structure, the time for whole processes of transporting a carrier is shortened, because the number of operations can be decreased.

Another object of the present invention is to provide a method for transporting a carrier by using such a carrier transporting apparatus.

Still another object of the present invention is to provide a transporting apparatus for transporting an object with a simple structure which does not require upward and downward movements of an object and guides and a system for such movements.

In accordance with one aspect of the present invention, a carrier transporting apparatus comprises a test section in which devices under test loaded on a carrier are tested and in which an opening is formed such that the carrier is carried out from the test section through the opening, a shutter provided on the test section for opening and closing the opening and a carrier guide for guiding the carrier in a direction to cross the direction in which the carrier is carried out from the test section. Moreover, the carrier guide is integrated with the shutter. Hereinafter, the direction in which the carrier is carried out from the test section may be referred to as a carrying-out direction, and the direction to cross the carrying-out direction may be referred to as a cross direction. Furthermore, the carrier guide moves to a waiting position where the carrier guide does not obstruct the carrier when the carrier is carried out from the test section, as the shutter is opened, and the carrier guide moves to an guiding position where the carrier guide guides the carrier in the cross direction, as the shutter is closed.

According to the carrier transporting apparatus, because the carrier guide and the shutter are integrated, when the carrier is carried out from the test section, a process of opening the shutter and a process of moving the carrier guide to the waiting position are performed at once. As a result, it is possible to shorten time required for carrying out the carrier. Additionally, a particular driving mechanism is not required to move the carrier guide to the waiting position, and a space for such a driving mechanism is not required either.

Furthermore, after carrying out the carrier from the test section, a process of closing the shutter and a process of moving the carrier guide to the guiding position are performed at once. As a result, it is possible to shorten time required for transporting the carrier. Additionally, a particular driving mechanism is not required to move the carrier guide to the guiding position, and a space for such a driving mechanism is not required either, just like the case of carrying out the carrier.

A transporting path on which the carrier is carried out from the test section and transported in the cross direction may be provided to be flat. If the transporting path is flat, no mechanism for moving upward and downward the carrier is required, no space for such a mechanism is required, and no time for moving upward and downward the carrier is required.

The shutter may be moved upward to open the opening and moved downward to close the opening, and the carrier guide may protrude horizontally from a bottom portion of the shutter. With such a structure, the carrier transporting apparatus according to the present invention described above can be realized preferably.

The carrier transporting apparatus may further comprise a guide stopper. In this case, the guide stopper is brought into contact with a front side portion of the carrier when the carrying out of the carrier is completed, and the front side portion is a side portion of the carrier facing the carrying-out direction. As a result, the guide stopper restricts movement of the carrier and guides the carrier while transporting the carrier in the cross direction. Furthermore, the carrier guide and the guide stopper coordinate so as to guide two opposite side portions of the carrier while the carrier is transported in the cross direction.

According to the carrier transporting apparatus with such a guide stopper, when the carrying out of the carrier is completed, the guide stopper is brought into contact with the front side portion of the carrier for stopping the carrier. The carrier guide is moved to the waiting position as the shutter is moved downward after the carrier is carried out, so that the carrier guide guides a rear side portion of the carrier. The rear side portion is opposite to the front side portion that is guided by the carrier stopper. As a result, the carrier is between the carrier guide and the carrier stopper. Therefore, while the carrier is transported in the cross direction, the guide stopper and the carrier guide cooperate to guide the two opposite side portions of the carrier.

A front edge of the carrier guide may be brought into contact with the carrier for guiding the carrier, and the front edge may be shaped to have a vertical flat surface. In this case, because the carrier guide guides the carrier with the front edge and the front edge is shaped to have a vertical flat surface, an area where the front edge is in contact with the carrier is broad. Therefore, even if the carrier guide is not precisely placed at the guiding position from the waiting position, an area where the front edge is in contact with the carrier is broad enough to guide the carrier properly.

The test section may have a function as a thermostat.

The carrier transporting apparatus may be adapted for an automatic handler.

In accordance with another aspect of the present invention, a method of transporting a carrier in a carrier transporting apparatus comprises the steps of: moving the carrier guide to a waiting position where the carrier guide does not obstruct the carrier when the carrier is carried out from the test section, as the shutter is opened for carrying out the carrier from the test section after testing the devices under test; moving the carrier guide to a guiding position where the carrier guide guides the carrier in the cross direction, as the shutter is closed after the carrier is carried out; and guiding the carrier by the carrier guide so that the carrier is transported in the cross direction. The carrier transporting apparatus comprises a test section in which devices under test loaded on a carrier are tested and in which an opening is formed such that the carrier is carried out from the test section through the opening; a shutter provided on the test section for opening and closing the opening; and a carrier guide for guiding the carrier in the cross direction. The carrier guide is integrated with the shutter so that the carrier guide moves to a waiting position where the carrier guide does not obstruct the carrier when the carrier is carried out from the test section, as the shutter is opened. Moreover, the carrier guide moves to a guiding position where the carrier guide guides the carrier in the cross direction, as the shutter is closed.

According to the method of transporting a carrier as described above, it is possible to shorten time for carrying out and transporting a carrier. Furthermore, the structure of the carrier transporting apparatus for the method can be simple without a particular driving mechanism for moving the carrier guide to the waiting position and the guiding position, saving a space for such a driving mechanism.

In accordance with still another aspect of the present invention, the transporting apparatus comprises a chamber which contains an object and in which an opening is formed such that the object is carried out from the chamber through the opening; a shutter provided on the chamber for opening and closing the opening; and a guide for guiding the object in a cross direction, the cross direction crossing a carry-out direction in which the object is carried out from the chamber. Furthermore, the guide is integrated with the shutter so that the guide moves to a waiting position where the guide does not obstruct the object when the carrier is carried out from the chamber, as the shutter is opened, and the guide moves to a guiding position where the guide guides the object in the cross section, as the shutter is closed.

BRIEF DESCRIPTION OF THE DRAWINGS

The present invention will become more fully understood from the detailed descriptions given hereinbelow and the accompanying drawings which are given by way of illustration only, and thus the descriptions and drawings are not intended as a definition of the limits of the present invention, and wherein:

FIGS. 3A to 6B are views for explaining steps of transporting a carrier on a carrier transporting apparatus, wherein FIGS. 3A, 4A, 5A and 6A are plane views showing the carrier transporting apparatus and FIGS. 3B, 4B, 5B and 6B are cross-sectional side views schematically illustrating main sections of the exit of the test section and the vicinity thereof;

PREFERRED EMBODIMENT OF THE INVENTION

An embodiment of the present invention will be explained with reference to FIGS. 1 to 7B. In the embodiment, a carrier transporting apparatus 50 according to the present invention is used for an automatic handler 100 having a high and low temperature testing function, as an example for explanation. The automatic handler 100 comprises an IC tester and the like which are not shown. Among elements of the carrier transporting apparatus 50, the same reference numerals are attached to the same portions as the earlier developed carrier transporting apparatus explained previously, and explanations for them may be omitted unless there is particular necessity.

Figure 2A:
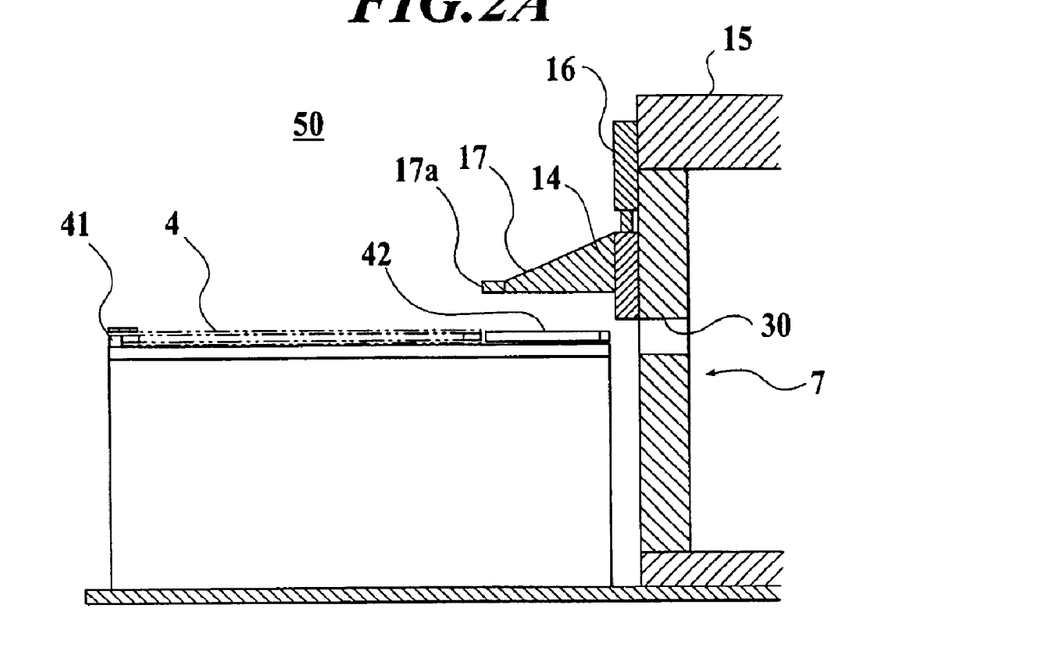
FIGS. 2A and 2B are cross-sectional side views schematically illustrating main sections of an exit of a test section and the vicinity thereof.
Figure 2B:
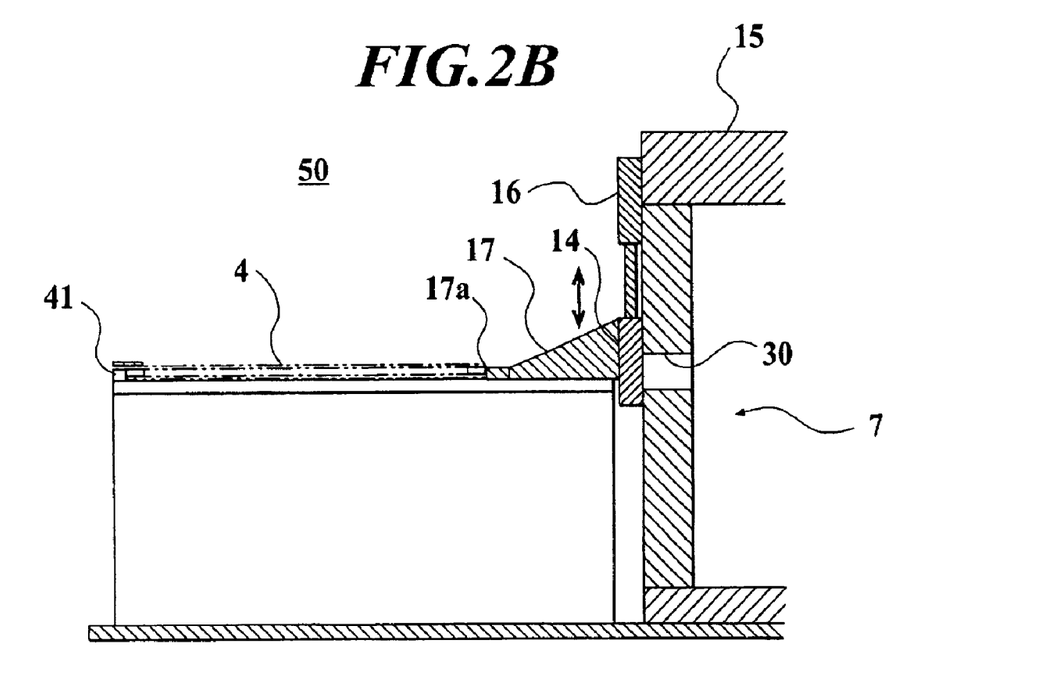

Firstly, a structure of the carrier transporting apparatus 50 according to the present invention will be explained. As shown in FIG. 1, the carrier transporting apparatus 50 comprises a thermostat 15 as a test section, and the thermostat 15 accommodates a carrier 4 loading devices under test, such as ICs (not shown), during test of the devices under test. An opening 30 is formed in the thermostat 15, and a shutter 14 is disposed on the thermostat 15 for opening and closing the opening 30. The carrier 4 is carried out from a drying chamber 7 of the thermostat 15 to a buffer section 8 through the opening 30 after the test of the devices under test. As shown in FIGS. 2A and 2B, the opening 30 is formed to horizontally penetrate an external wall of the thermostat 15. The shutter 14 is positioned on the outside of the opening 30. The opening 30 can be opened and closed by moving the shutter upward and downward with driving means such as a cylinder 16, for example.

Figure 3A:
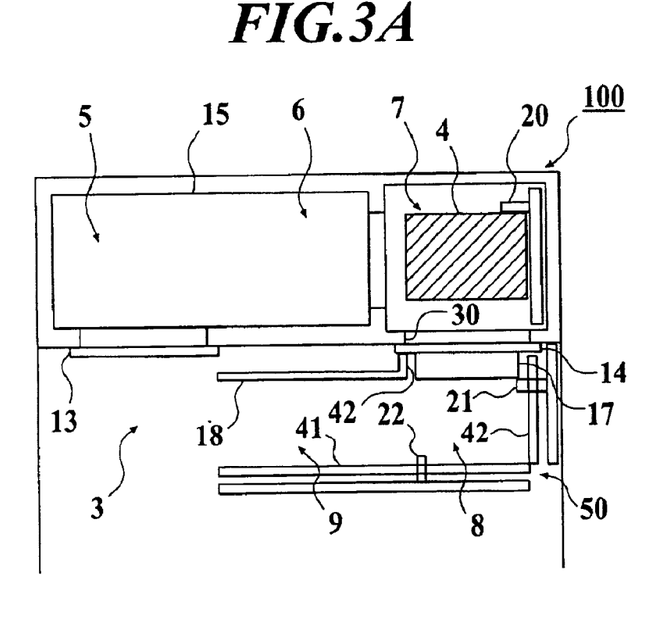
Figure 3B:
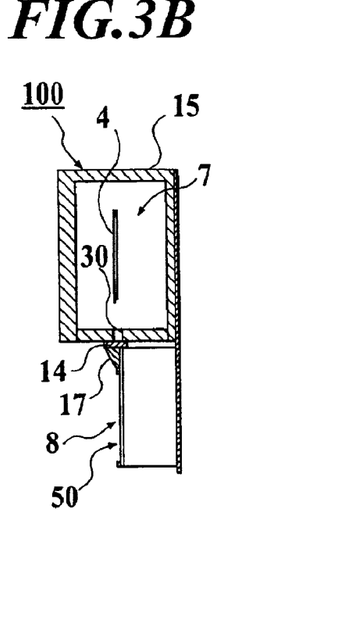

As shown in FIG. 3A, a drying chamber 7 is provided with a push hand 20. The push hand 20 is moved in the carrying-out direction while the push hand 20 abuts with a rear side portion of the carrier 4. The rear side portion is a side portion being opposite to a side portion facing the carrying-out direction. As a result, the push hand 20 pushes the carrier 4 out of the drying chamber 7. A pull hand 21 is disposed on a side of the buffer section 8. The carrier 4 pushed out of the drying chamber 7 by the push hand 20 is pulled to the buffer 8 by the pull hand 21.

As shown in FIGS. 2A and 2B, the shutter 14 is provided with a carrier guide 17 to integrate with the shutter 14, and the carrier guide 17 protrudes horizontally from a bottom portion of the shutter 14. After the carrier 4 is carried out from the thermostat 15 to the buffer 8 through the opening 30, the carrier guide 17 guides the carrier 4 when the carrier 4 is transported to an accommodation section 9 in a cross direction.

Because the carrier guide 17 is integrated with the shutter 14, the carrier guide 17 is moved upward and downward as the shutter 14 is opened and closed. As shown in FIG. 2A, the carrier guide 17 is positioned at a waiting position as the shutter 14 is opened, and the carrier guide 17 does not obstruct the carrier 4 at the waiting position when the carrier 4 is carried out from the thermostat 15. On the other hand, as shown in FIG. 2B, the carrier guide 17 is positioned at a guiding position as the shutter 14 is closed, and the carrier guide 17 guides the carrier 4 in the cross direction at the guiding position during the transportation of the carrier 4.

More practically, the carrier guide 17 comprises a guide portion 17a on a front edge thereof, and the guide portion 17a guides the rear side portion of the carrier 4. The guide portion 17a is shaped to have a flat surface, and the flat surface is positioned to be vertical where the carrier guide 17 is integrated with the shutter 14.

As shown in FIGS. 2A and 2B and FIGS. 3A to 6B, the carrier transporting apparatus 50 comprises carrying-out direction guides 42 that guide the carrier 4 in the carrying-out direction when the carrier 4 is carried out from the thermostat 15. The carrying-out direction guides 42 guide the carrier 4 from two sides that cross the carrying-out direction.

The carrier transporting apparatus 50 further comprises a guide stopper 41 that is brought into contact with a front side portion of the carrier 4, which is a side portion facing the carrying-out direction, for restricting movement of the carrier 4. The guide stopper 41 also has a function of guiding the front side portion of the carrier 4 when the carrier 4 is transported from the buffer section 8 to the accommodation section 9 in the cross direction. Transporting the carrier 4 in the cross direction is performed by a transporting hand 22 which is provided at a side of the guide stopper 41.

A transporting path on which the carrier 4 is carried out from the drying chamber 7 to the accommodation section 9 through the buffer section 8 is formed to be flat and horizontal.

Next, steps of transporting the carrier 4 will be explained. Because the transportation of the carrier 4, the test of devices under test such as ICs and the shifting of devices under test performed from the accommodation section 9 to the drying chamber 7 through a supply section 3, a preheat section 5 and a measuring section 6 are performed in the same way as the earlier developed technology explained previously, explanations of them are omitted.

Firstly, after the carrier 4 is heated in the drying chamber 7, the shutter 14 is opened. As shown in FIG. 2A, as the shutter is moved upward, the carrier guide 17 is moved upward to the waiting position where the carrier guide 17 does not obstruct the carrier 4 when the carrier 4 is carried out from the thermostat 15. In this case, the carrier 4 is pushed out of the drying chamber 7 by the push hand 20 as shown FIGS. 3A and 3B and FIGS. 4A and 4B, and then successively pulled to the buffer section 8 by the pull hand 21 successively as shown in FIGS. 5A and 5B and FIGS. 6A and 6B. By operating these steps, it is completed to carry out the carrier 4 from the drying chamber 7 to the buffer section 8. During these steps, the carrying-out direction guides 42 guide the carrier 4 in the carrying-out direction.

Figure 5A:
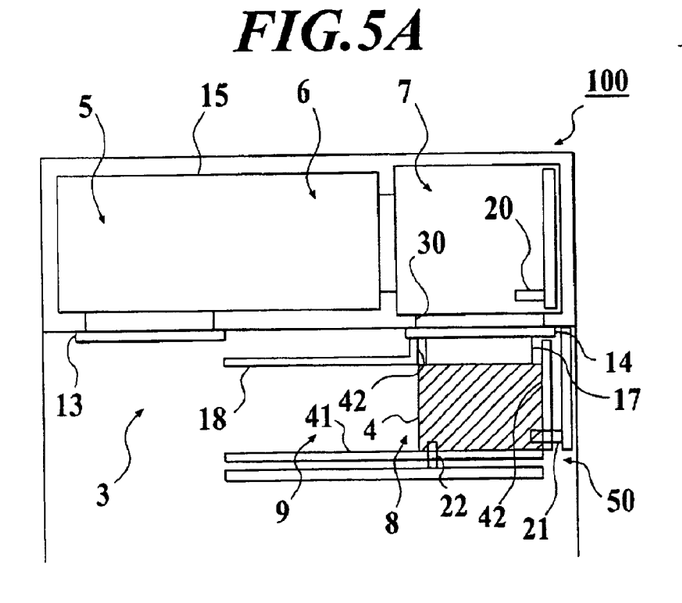
Figure 5B:
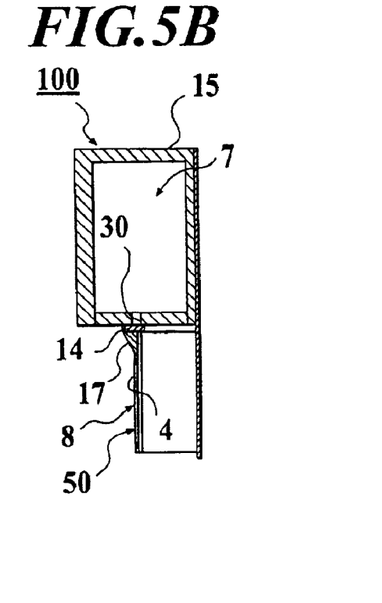

When the carrying-out of the carrier 4 is completed, the guide stopper 41 is brought into contact with the front side of the carrier 4, which faces the carrying-out direction, so that movement of the carrier 4 in the carrying-out direction is restricted, as shown in FIGS. 5A and 5B (also see FIG. 2A).

After the carrier 4 is carried out as described above, the shutter 14 is closed to prevent a drop in the temperature inside the thermostat 15 as shown in FIG. 2B. As the shutter 14 is closed, the carrier guide 17 is moved downward corresponding to the shutter 14 and moved to a guiding position for guiding the carrier 4 while transporting the carrier 4 in the cross direction. As a result, the carrier 4 is between the carrier guide 17 and the guide stopper 41.

Thereafter, the transporting hand 22 transports the carrier 4 in the cross direction, from the buffer section 8 to the accommodation section 9 as shown in FIGS. 5A and 5B and FIGS. 6A and 6B. During this transportation, the guide stopper 41 and the carrier guide 17 guide two opposite side portions of the carrier 4, which are the front side portion facing the carrying-out direction and the rear side portion being opposite to the front side portion.

According to the carrier transporting apparatus 50 of the present invention as described above, because the carrier guide 17 is provided to integrate with the shutter 14, an operation of opening the shutter 14 for carrying out the carrier 4 from the drying chamber 7 of the thermostat 15 and an operation of moving the carrier guide 17 to the waiting position where the shutter 14 does not obstruct the carrier 4 are performed at once. Therefore, time for carrying out the carrier 4 is shortened. Besides, a particular driving mechanism is not required for moving the carrier guide 17 to the waiting position, and a space for such a driving mechanism is not required either.

Moreover, an operation of closing the shutter 14 after carrying out the carrier 4 and an operation of moving the carrier guide 17 to the guiding position for guiding the carrier 4 during the transportation of the carrier 4 in the cross direction are performed at once. Therefore, time for the transportation of the carrier 4 is shortened. Besides, a particular driving mechanism is not required to move the carrier guide 17 to the guiding position, and a space for such a driving mechanism is not required, in the same way as the carrying out of the carrier 4.

Furthermore, because the transporting path is flat, a particular mechanism for moving the carrier 4 upward and downward is not required, a space for such a mechanism is not required, and time for moving the carrier upward and downward is not required.

Besides, because the carrier transporting apparatus 50 comprises the guide stopper 41, the guide stopper 41 is brought into contact with the front side portion of the carrier 4 to restrict a movement of the carrier 4 when the carrying out of the carrier 4 is completed. As the shutter 17 is closed after the carrying out of the carrier 4, the carrier guide 17 is moved down to the guiding position for guiding the rear side portion of the carrier 4. As a result, the carrier 4 is between the carrier guide 17 and the guide stopper 41, and the carrier guide 17 and the guide stopper 41 can guide two opposite side portions of the carrier 4. Accordingly, during the transportation of the carrier 4 in the cross direction, the carrier guide 17 and the guide stopper 41 cooperate to preferably guide the two opposite side portions of the carrier 4.

The carrier guide 17 guides the carrier 4 with a carrier guide portion 17a. The carrier guide portion 17a is shaped to have a vertical flat surface so that an area where the carrier guide portion 17a is in contact with the carrier 4 is broad. Therefore, even if the carrier guide 17 is not precisely placed at the guiding position after the carrier guide 17 is moved from the waiting position, an area where the carrier guide portion 17a is in contact with the carrier 4 is broad enough to guide the carrier 4 appropriately.

Figure 6A:
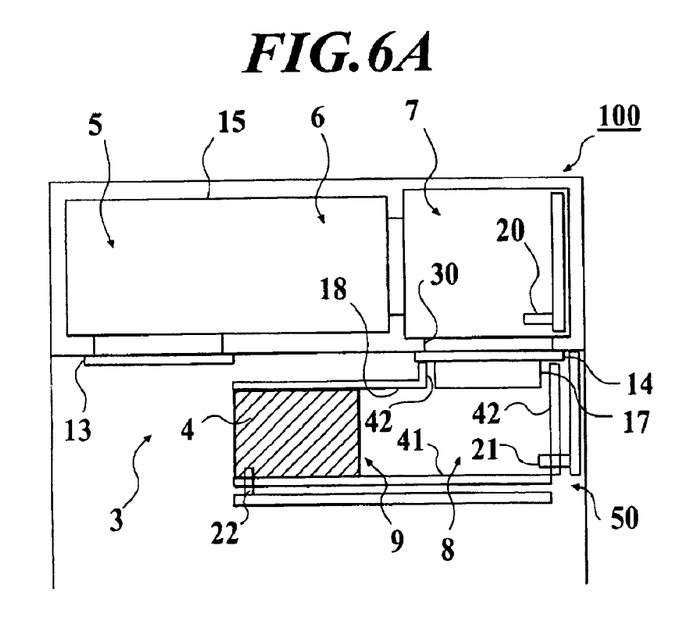
Figure 6B:
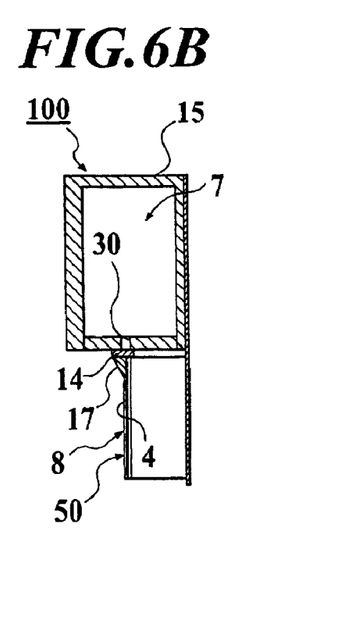

After the carrier 4 is transported to the end of the carrier guide portion 17a, the carrier is guided by the guide stopper 41 and a cross direction guide 18, as shown in FIGS. 6A and 6B. The cross direction guide 18 is provided such that the cross direction guide 18's surface being in contact with the carrier 4 and the carrier guide portion 17a's surface being in contact with the carrier 4 are lined to form a plane, such that the plane smoothly guides the carrier 4. As a result, the carrier 4 can be smoothly shifted from the carrier guide portion 17a to the cross direction guide 18. Furthermore, the cross direction guide 18 is provided so that the carrier 4 is between the cross direction guide 18 and the carrier guide portion 17a. As a result, during the transportation of the carrier 4 in the cross direction, the carrier 4 is guided by the carrier guide portion 17a and the guide stopper 41 and then guided by the cross direction guide 18 and the guide stopper 41 successively.

Although the transporting path of the carrier 4 is provided as clockwise according to the above-described embodiment, the transporting path according to the present invention can be provided as anti-clockwise as a matter of course. According to the present invention, the cross direction may cross the carrying-out direction at any angle, and the cross direction is perpendicular to the carrying-out direction preferably. According to the embodiment, the carrier transporting apparatus 50 of the present invention is applied to the automatic handler 100. However, the carrier transporting apparatus 50 of the present invention can be applied to other apparatuses.

The entire disclosure of Japanese Patent Application No. Tokugan 2000-358192 filed on Nov. 24, 2000 including specification, claims, drawings and summary is incorporated herein by reference in its entirety.

What is claimed is:

1. A carrier transporting apparatus comprising:
   a thermostat including a test section in which devices under test loaded on a carrier are tested and in which an opening is formed such that the carrier is carried out from the thermostat through the opening, the carrier having a plate-like shape including a first linear side and a second linear side intersecting the first linear side;

a carrying-out direction guide to guide the first linear side of the carrier in a carrying-out direction in which the carrier is carried out from the thermostat; and a shutter which is provided on the thermostat for opening and closing the opening, and of which an end surface facing the carrying-out direction functions as a cross direction guide to guide the second linear side of the carrier in a cross direction crossing the carrying-out direction, wherein the shutter moves to a waiting position where the shutter does not obstruct the carrier when the carrier is carried out from the thermostat, as the shutter is opened, and the shutter moves to a guiding position where the shutter guides the carrier in the cross direction, as the shutter is closed.

2. The carrier transporting apparatus as claimed in claim 1, wherein a transporting path on which the carrier is carried out from the thermostat and transported in the cross direction is set to be flat.

3. The carrier transporting apparatus as claimed in claim 1, wherein the shutter is moved upward to open the opening and moved downward to close the opening, and the end surface facing the carrying-out direction protrudes horizontally from a bottom portion of the shutter.

4. The carrier transporting apparatus as claimed in claim 1, further comprising a guide stopper which is brought into contact with an end portion of the carrier for restricting movement of the carrier when the carrying out of the carrier from the thermostat is completed and for guiding the carrier during the transportation of the carrier in the cross direction, the end portion of the carrier facing the carrying-out direction, wherein the shutter and the guide stopper coordinate so as to guide the second linear side and the end portion of the carrier, respectively, while the carrier is transported in the cross direction.

5. The carrier transporting apparatus as claimed in claim 1, wherein the end surface of the shutter is brought into contact with the carrier for guiding the carrier, and the end surface is shaped to have a vertical flat surface.

6. The carrier transporting apparatus as claimed in claim 1, being adapted for an automatic handler.

7. The carrier transporting apparatus as claimed in claim 4, wherein the carrier has at least one of a square shape or a rectangular shape.

\* \* \* \* \*